United States Patent
Yu et al.

(10) Patent No.: US 7,795,933 B2
(45) Date of Patent: Sep. 14, 2010

(54) PLL-BASED TIMING-SIGNAL GENERATOR AND METHOD OF GENERATING TIMING SIGNAL BY SAME

(75) Inventors: Ming-Shih Yu, Taipei (TW); Song-Rong Han, Taipei (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 62 days.

(21) Appl. No.: 12/253,551

(22) Filed: Oct. 17, 2008

(65) Prior Publication Data

US 2009/0128203 A1 May 21, 2009

(30) Foreign Application Priority Data

Nov. 19, 2007 (TW) .............................. 96143758 A

(51) Int. Cl.
*H03L 7/06* (2006.01)
(52) U.S. Cl. ...................................... 327/156; 327/160
(58) Field of Classification Search .................. 327/156
See application file for complete search history.

(56) References Cited

U.S. PATENT DOCUMENTS

| | | | |
|---|---|---|---|
| 5,270,582 A | 12/1993 | Brown et al. | |
| 5,905,967 A | 5/1999 | Botham | |
| 6,253,360 B1 | 6/2001 | Yoshiba | |
| 6,329,850 B1 * | 12/2001 | Mair et al. | 327/107 |
| 6,943,598 B2 * | 9/2005 | Ghazali et al. | 327/147 |
| 6,975,665 B1 | 12/2005 | McCorkle | |
| 7,131,022 B2 | 10/2006 | Dahlgren et al. | |
| 7,230,461 B1 * | 6/2007 | Savoj | 327/156 |
| 2005/0030073 A1 * | 2/2005 | Wakayama et al. | 327/156 |

* cited by examiner

*Primary Examiner*—Lincoln Donovan
*Assistant Examiner*—Khareem E Almo
(74) *Attorney, Agent, or Firm*—Winston Hsu

(57) ABSTRACT

A timing-signal generator includes a PLL circuit, one or more rising/falling edge generating unit and one or more timing-signal generating unit. In response to a reference signal with a frequency $F_{ref}$, the PLL outputs M voltage controlled signals with the same frequency $F_{vco}=N*F_{ref}$ and equally distributed phase differences. The rising/falling edge generating unit is for generating a rising point signal and a falling point signal corresponding to respective ones one of M*P candidate timing points which are defined in a cycle of the reference signal according to the M voltage controlled signals. The timing-signal generating unit coupled to the rising/falling edge generating unit is for generating a timing signal which toggles high in response to the rising point signal and toggles low in response to the falling point signal.

12 Claims, 18 Drawing Sheets

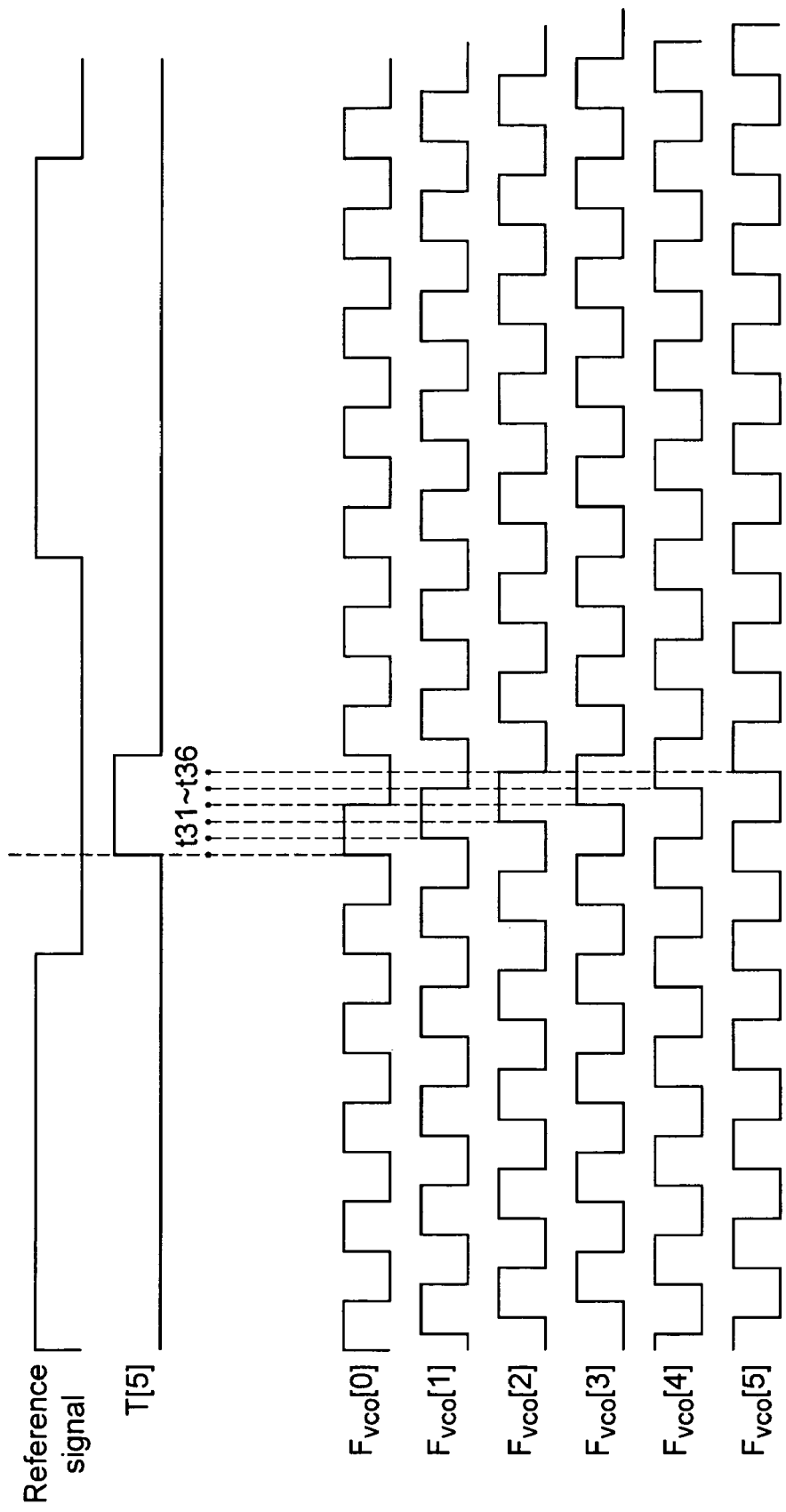

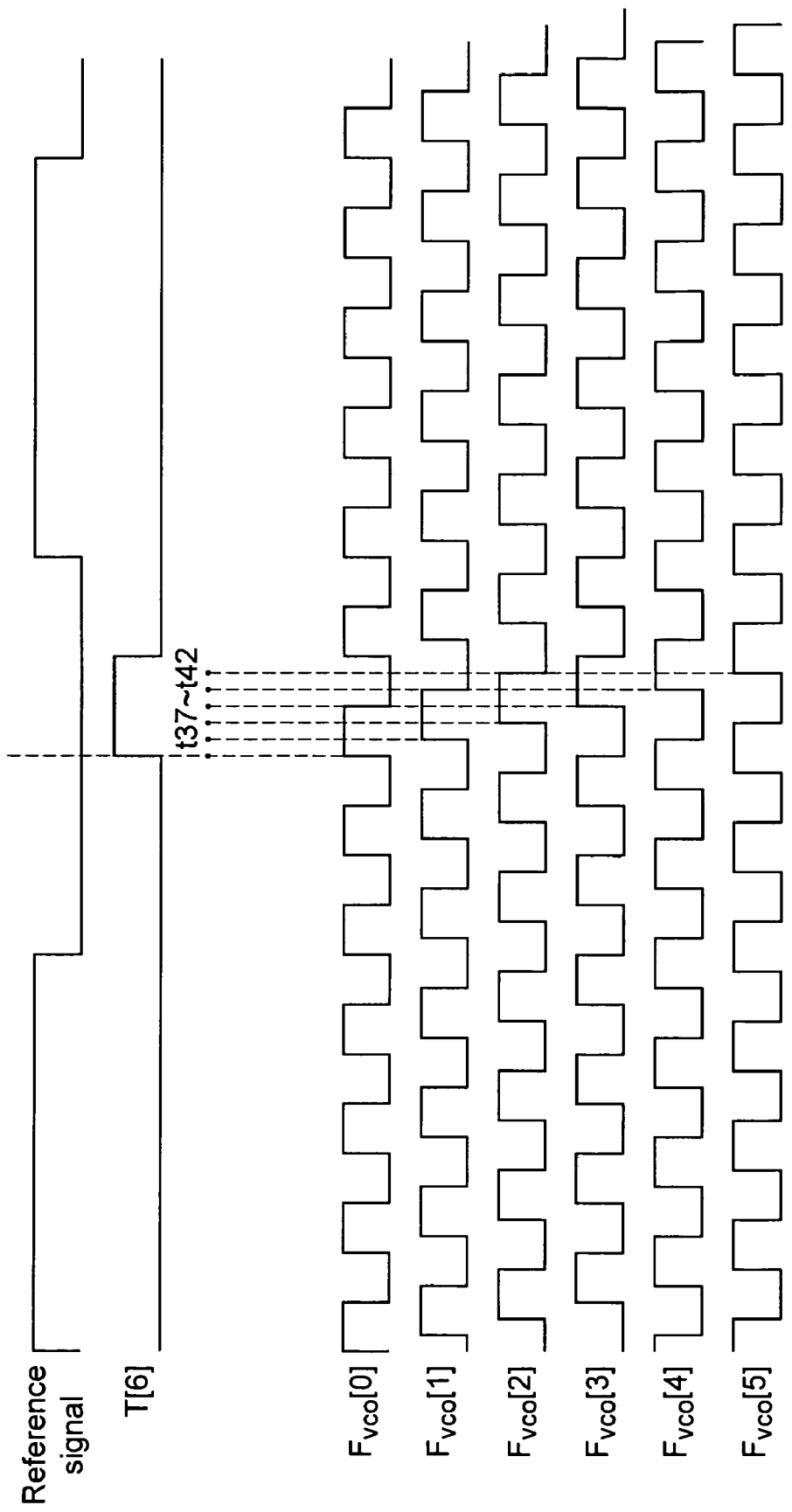

PLL-BASED TIMING-SIGNAL GENERATOR AND METHOD OF GENERATING TIMING SIGNAL BY SAME

FIELD OF THE INVENTION

The present invention relates to a timing-signal generator, and more particularly to a PLL-based timing generator. The present invention also relates to a method for generating a timing signal by a PLL-based timing generator.

BACKGROUND OF THE INVENTION

It is well known that an image sensor such as a charge coupled device (CCD), a complementary metal oxide semiconductor (CMOS) device or the like is essential to a digital camera or digital video camera. In the image sensor, timing signals and control signals varying with time are generated for the acquisition of pixel data. A timing generator is provided in the image sensor for this task, and it is preferred to flexibly fit a variety of applications.

SUMMARY OF THE INVENTION

Therefore, the present invention provides a PLL-based timing-signal generator for generating a timing signal with a variable rising edge, falling edge and/or duty cycle.

The present invention provides a timing-signal generator, which includes: a PLL circuit for outputting M voltage controlled signals in response to a reference signal, wherein every adjacent two of the M voltage controlled signals have the same frequency and a first constant phase difference; a rising/falling edge generating unit coupled to the PLL circuit for receiving the M voltage controlled signals, and generating a rising point signal and a falling point signal corresponding to respective ones of M*P candidate timing points which are defined in a cycle of the reference signal according to the M voltage controlled signals; and; and a timing-signal generating unit coupled to the rising/falling edge generating unit for generating a timing signal which toggles high in response to the rising point signal and/or toggles low in response to the falling point signal.

For example, the timing-signal generating unit is an SR flip-flop, and a set end thereof receives the rising point signal and a reset end thereof receives the falling point signal, or the timing-signal generating unit is a JK flip-flop, and a J end thereof receives the rising point signal and a K end thereof receives the falling point signal.

In an embodiment, the frequency of each of the M voltage controlled signals is $F_{vco}$; the frequency of the reference signal is $F_{ref}$; and $F_{vco}=N*F_{ref}$ where N is a positive integer. The rising-edge generating unit includes: a Jason counter coupled to the PLL circuit for receiving one of the M voltage controlled signals at a time and dividing the frequency $F_{vco}$ of the voltage controlled signal by P to output P counting signals, wherein P is a positive integer and every adjacent two of the P counting signals have the same frequency and a second constant phase difference; an edge combiner coupled to the Jason counter for generating P dividing signals according to rising edges and falling edges of the P counting signals; a multiplexer coupled to the edge combiner for selecting one of the P dividing signals to be outputted according to control bits; a digital phase selector coupled to the PLL circuit for selecting one of the M voltage controlled signals to be outputted according to the control bits; a D flip-flop coupled to the multiplexer and the digital phase selector for generating an output according to the selected dividing signal and the selected voltage controlled signal as inputs thereof; and an edge detector coupled to the D flip-flop for generating a pulse to enable the rising point signal when the output of the D flip-flop is switched from a low level to a high level.

In an embodiment, the falling-edge generating unit has the same circuitry as the rising-edge generating unit, including a Jason counter, an edge combiner, a multiplexer, a digital phase selector, a D flip-flop and an edge detector, thereby generating a pulse to enable the falling point signal when the output of the D flip-flop is switched from a high level to a low level.

In an embodiment, the PLL circuit includes: a phase/frequency detector detecting phase and frequency differences between the reference signal and a frequency-divided signal to output a phase-difference signal; a charge pump coupled to the phase/frequency detector for generating an output current in response to a voltage level of the phase difference signal; a loop filter coupled to the charge pump for converting the output current into a controlled voltage; a voltage-controlled oscillator coupled to the loop filter for generating M voltage controlled signals in response to the controlled voltage; and a frequency-dividing unit coupled to the voltage-controlled oscillator and the phase/frequency detector for dividing the frequency $F_{vco}$ of one of the M voltage controlled signals by N to obtain the frequency-divided signal.

The present invention also provides a method for use in a PLL-based timing-signal generator to generate a timing signal according to a reference signal. The method includes steps of: receiving M voltage controlled signals in sequence, wherein every adjacent two of the M voltage controlled signals have the same frequency and a first constant phase difference; generating P counting signals according to the M voltage controlled signals, wherein P is a positive integer and every adjacent two of the P counting signals have the same frequency equal to 1/P of the frequency of the M voltage controlled signals and a second constant phase difference, thereby defining M*P candidate timing points in a cycle of the reference signal; generating a rising point signal corresponding to a first one of M*P candidate timing points; generating a falling point signal corresponding to a second one of the M*P candidate timing points; and generating the timing signal which toggles high in response to the rising point signal and toggles low in response to the falling point signal.

In an embodiment, the rising point signal is generated by: generating P dividing signals according rising edges and falling edges of the P counting signals; generating an output signal in response to one of the P dividing signals and one of the M voltage controlled signals selected according to control bits; and enabling the rising point signal when a voltage level of the output signal is changed from low to high. Likewise, the falling point signal is generated by: generating P dividing signals according rising edges and falling edges of the P counting signals; generating an output signal in response to one of the P dividing signals and one of the M voltage controlled signals selected according to control bits; and enabling the falling point signal when a voltage level of the output signal is changed from high to low.

BRIEF DESCRIPTION OF THE DRAWINGS

The above contents of the present invention will become more readily apparent to those ordinarily skilled in the art after reviewing the following detailed description and accompanying drawings, in which:

FIG. 8F is a timing sequence diagram schematically showing the generation of a rising point signal by the rising-edge generator of FIG. 5 in a sixth example;

FIG. 8G is a timing sequence diagram schematically showing the generation of a rising point signal by the rising-edge generator of FIG. 5 in a seventh example;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

According to the present invention, a timing-signal generator for generating a timing signal with adjustable rising point, falling point and duty cycle is to be provided. In an embodiment, the timing signal can be obtained by providing a plurality of voltage controlled signals with equally-distributed phases. And in a preferred embodiment, the plurality of voltage controlled signals can be provided by a phase-locked loop (PLL) circuit.

Figure 1:
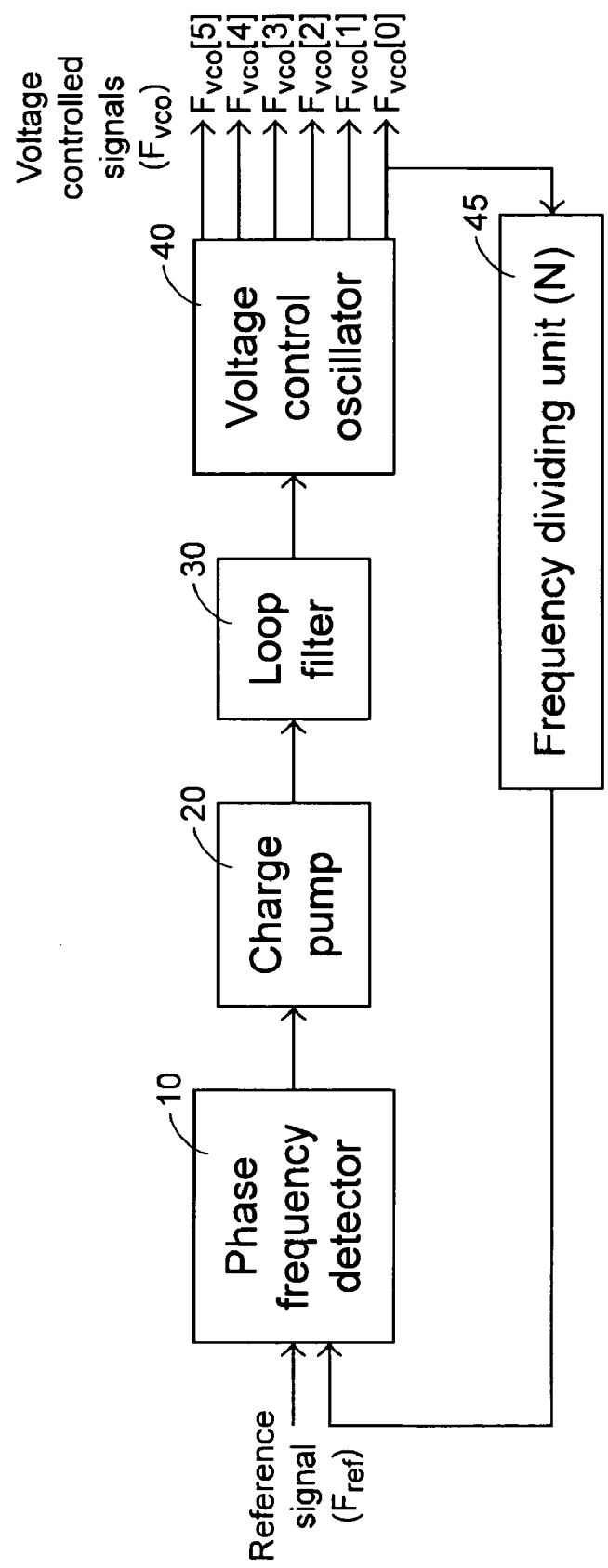
FIG. 1 is a block diagram schematically illustrating an embodiment of a phase-locked loop (PLL) circuit applicable to the present invention.

Please refer to FIG. 1. A phase-locked loop (PLL) according to an embodiment of the present invention includes a phase frequency detector 10, a charge pump 20, a loop filter 30, a voltage control oscillator 40 and a frequency dividing unit 45. The phase/frequency detector 10 receives a reference signal with a reference frequency $F_{ref}$ from a reference oscillator (nor shown) and a frequency-divided signal from the frequency dividing unit 45 and detects phase and frequency differences therebetween so as to output a phase difference signal. The charge pump 20 receives the phase difference signal and generates an output current with an intensity corresponding to the amplitude of the phase difference signal to the loop filter. Then the loop filter 30 smooths the output current and outputs a controlled voltage corresponding to the output current. The voltage control oscillator 40 receives the controlled voltage and outputs a plurality of, e.g. M, voltage controlled signals with the same frequency $F_{VCO}$ but different phases accordingly. The phase difference between every two adjacent voltage controlled signals is the same. For example, assuming M=6, six voltage controlled signals $F_{vco}[0]$, $F_{vco}[1]$, $F_{vco}[2]$, $F_{vco}[3]$, $F_{vco}[4]$ and $F_{vco}[5]$ with respective phases of 0, 60, 120, 180, 240, 300 degrees are obtained. The frequency dividing unit 45 receives and frequency-divides one of the M voltage controlled signals at one time. For example, the frequency dividing unit 45, after receiving the voltage controlled signal $F_{vco}[0]$, divides the frequency $F_{VCO}$ of the voltage controlled signal $F_{vco}[0]$ by N where N is a positive integer and $F_{vco}=N*F_{ref}$. For example, $F_{vco}$ is equal to 320 MHz on the conditions that $F_{ref}$ is equal to 40 MHz and N is equal to 8. With the M voltage controlled signals, a timing signal having the same frequency as the reference frequency $F_{ref}$ can be generated, and the timing signal may exhibit the features of adjustable rising point, falling point and duty cycle as described or exemplified in the following embodiments and examples.

Figure 2:
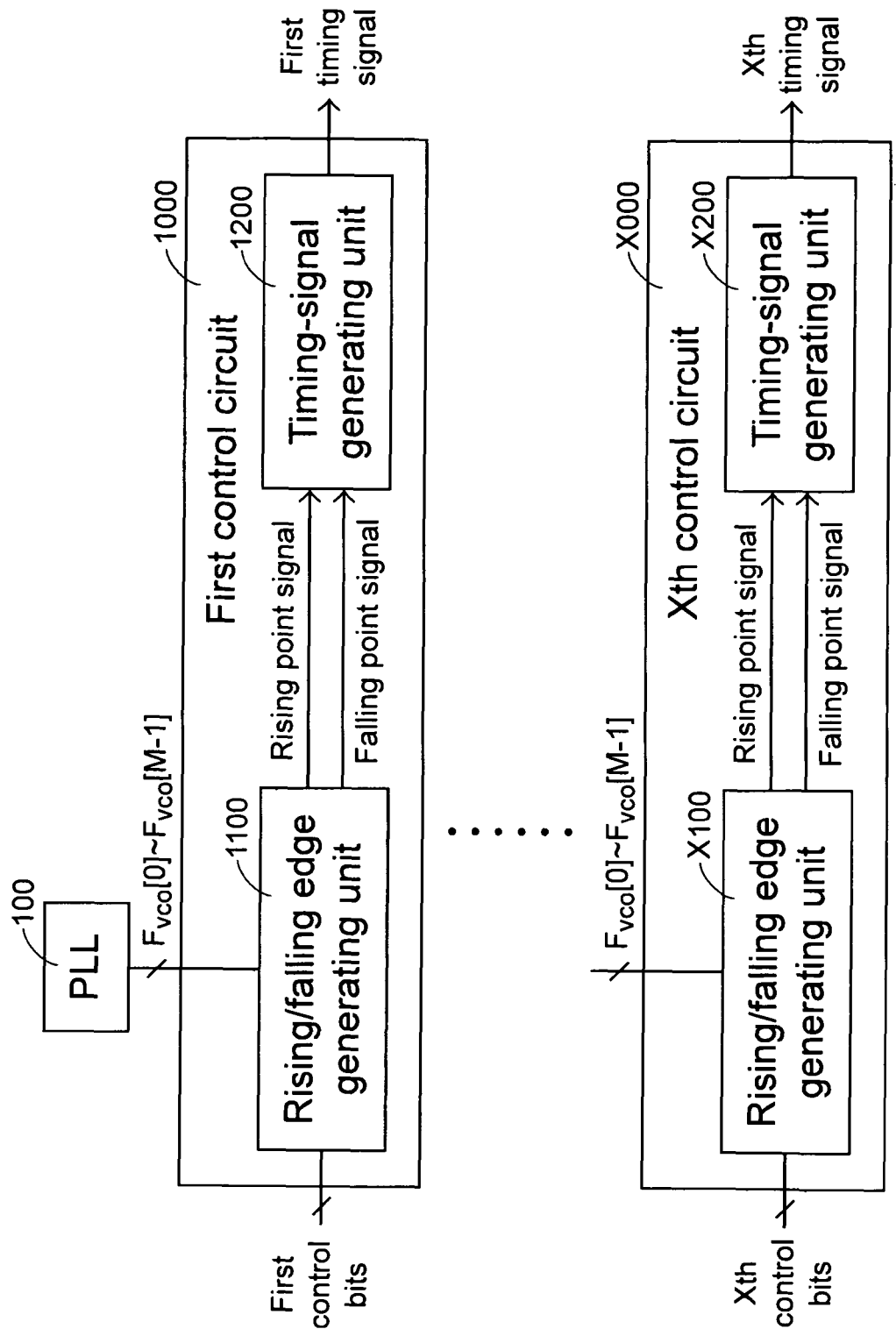
FIG. 2 is a block diagram schematically illustrating a timing-signal generator according to an embodiment of the present invention.

Please refer to FIG. 2. A timing-signal generator according to an embodiment of the present invention includes a PLL 100 and X control circuits 1000~X000 all coupled to the PLL 100 for receiving the M voltage controlled signals outputted by the PLL 100. The X control circuits 1000~X000 have similar circuitry and each of them is capable of generating a timing signal. In an embodiment, each of the control circuits 1000~X000 includes a rising/falling edge generating unit 1100~X100 and a timing-signal generating unit 1200~X200. Depending on respective control bits inputted to the control circuits, the resulting first to Xth timing signals may have independently adjustable rising edges, falling edges and duty cycles. Basically, the present invention can be described and understood with the presence of the PLL and only one control circuit, e.g. the first control circuit 1000. The provision of additional control circuits is adequate when more than one timing signal is required. Hereinafter, the operation of the control circuits is described with reference to the first control circuit 1000.

Figure 3:
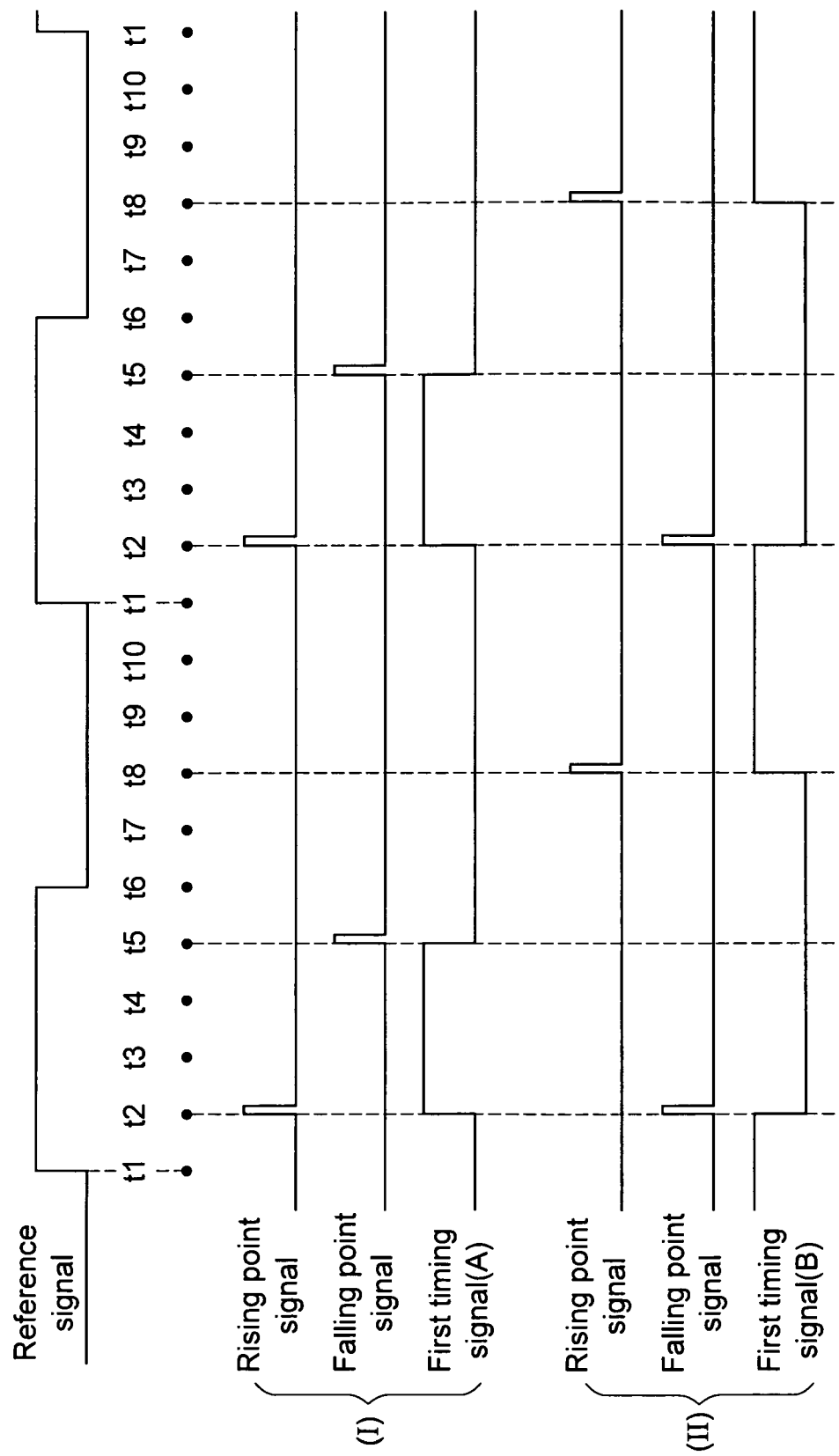
FIG. 3 is a timing sequence diagram schematically showing waveforms of signals associated with an embodiment of a first control circuit included in the timing-signal generator of FIG. 2.

As shown in FIG. 2, in the first control circuit 1000, the rising/falling edge generating unit 1100 receives M voltage controlled signals $F_{VCO}[0]$~$F_{VCO}[M-1]$ from the PLL 100 and the first control bits and generates a rising point signal and a falling point signal accordingly. The timing-signal generating unit 1200 then generates the first timing signal according to the rising point signal and the falling point signal. The waveforms of the associated signals are illustrated in FIG. 3.

For varying the rising points and falling points, a plurality of candidate timing points are provided for selection in each cycle of the reference signal. For example, 10 candidate timing points (t1~t10) are provided in each cycle of the reference signal. In Case (I), the second candidate timing point (t2) is selected as the rising point and the fifth candidate timing point (t5) is selected as the falling point in response to the first control bits. In other words, the first timing signal (A) outputted by the timing-signal generating unit 1200 rises at the second candidate timing point (t2) and falls at the fifth candidate timing point (t5), and thus has a duty cycle of 20%. In Case (II), the eighth candidate timing point (t8) is selected as the rising point and the second candidate timing point (t2) is selected as the falling point in response to the first control bits. In other words, the first timing signal (B) outputted by the timing-signal generating unit 1200 rises at the eighth candidate timing point (t8) and falls at the second candidate timing point (t2), and thus has a duty cycle of 40%.

Figure 4:
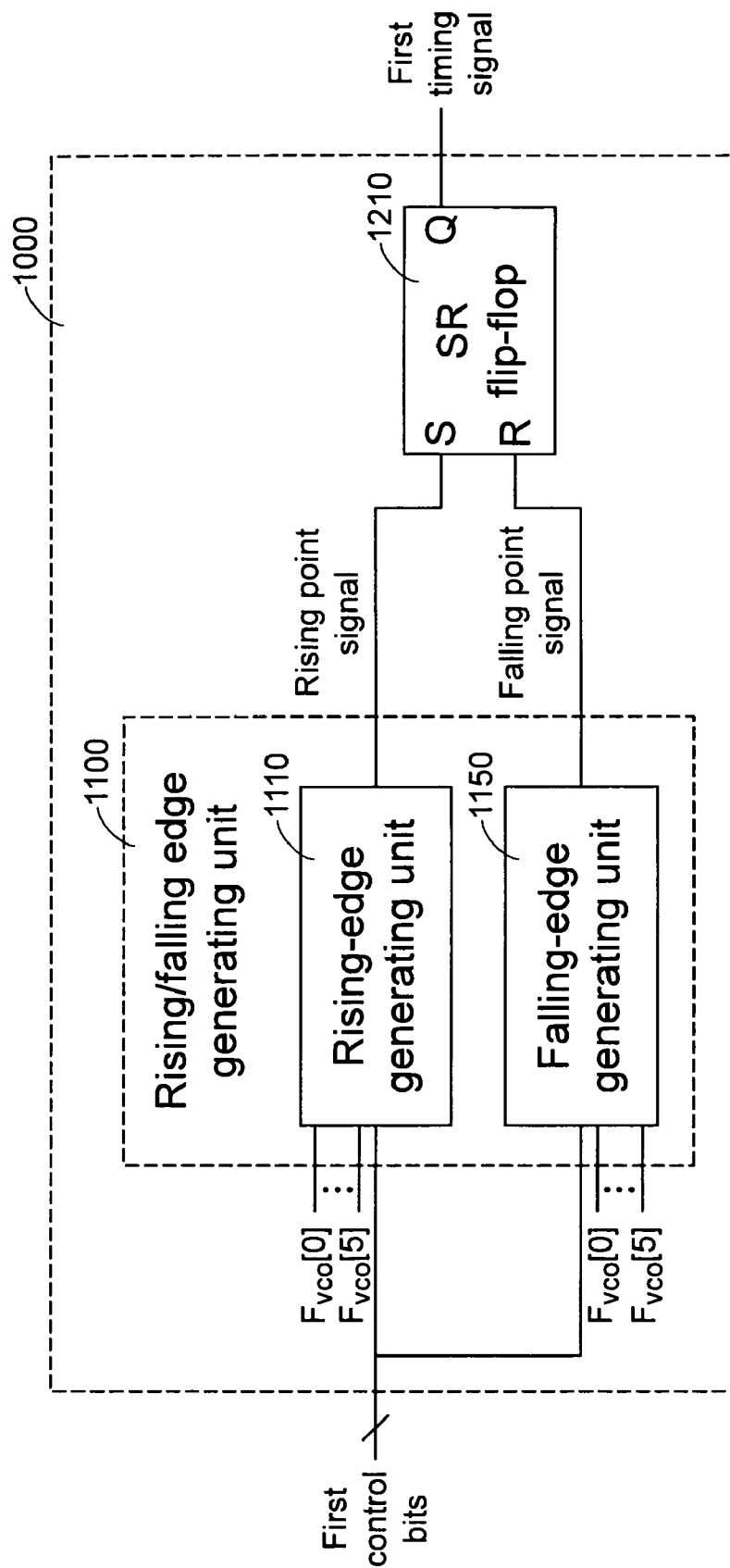
FIG. 4 is a circuit block diagram illustrating an embodiment of a first control circuit included in the timing-signal generator of FIG. 2.

The detailed descriptions about the selection of rising and falling points in response to the M voltage controlled signals $F_{VCO}[0]$~$F_{VCO}[M-1]$ and the first control bits and the synthesis of the first timing signal in response to the rising and falling points are given as follows with reference to FIG. 4. In an embodiment, the rising/falling edge generating unit 1100 includes a rising-edge generating unit 1110 for generating the rising point signal and a falling-edge generating unit 1150 for generating the falling point signal, wherein the rising-edge generating unit 1110 and the falling-edge generating unit 1150 have similar circuitry. The timing-signal generating unit 1200 is coupled to the rising-edge generating unit 1110 and implemented with an SR flip-flop 1210, wherein a set end (S) is used for receiving therefrom the rising point signal and a reset end (R) is used for receiving therefrom the falling point signal. Alternatively, the timing-signal generating unit 1200 can be implemented with other suitable circuitry such as a JK flip-flop. In this case, the J end and the K end of the JK flip-flop are used for receiving therefrom the rising point signal and the falling point signal, respectively.

Figure 5:
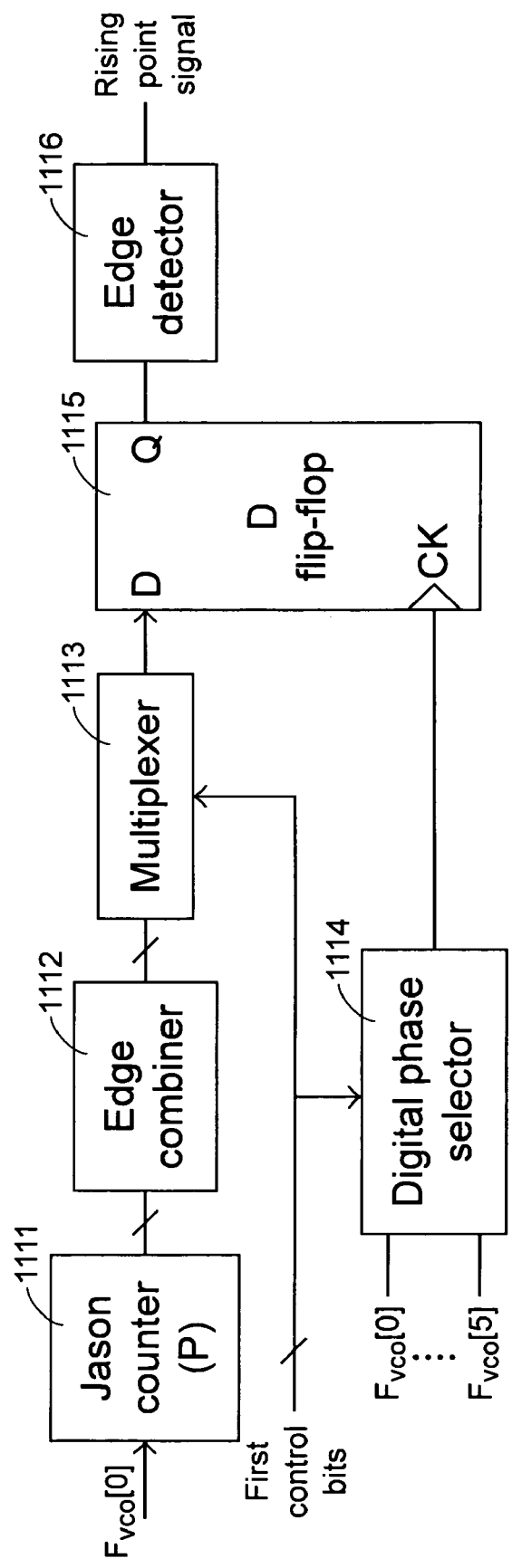
FIG. 5 is a circuit block diagram illustrating an embodiment of a rising-edge generator included in the first control circuit of FIG. 4.

FIG. 5 depicts an embodiment of the rising-edge generating unit 1110. The rising-edge generating unit 1110 includes a Jason counter 1111 which receives one of the voltage controlled signals and divides the frequency of the voltage controlled signal by a value P to obtain P counting signals with constant phase differences. An edge combiner 1112 generates P dividing signals according to rising and falling edges of the P counting signals. The P dividing signals are received and selectively outputted by a multiplexer 1113 according to the first control bits. Meanwhile, a digital phase selector (DPS) 1114 receives the M voltage controlled signals from the PLL 100 and selects one to be outputted according to the first control bits. A D flip-flop 1115 having an input end D coupled to the output of the multiplexer 1113, a clock input end CK coupled to the output of the DPS 1114, and an output end Q coupled to an edge detector 1116. The output of the edge detector 1116 represents the rising point signal.

For example, assuming M=6 and P=8, it means that six voltage controlled signals $F_{VCO}[0]$~$F_{VCO}[5]$ are inputted into the DPS 1114, wherein the voltage controlled signal $F_{VCO}[0]$ is inputted into the Jason counter 1111, and eight counting signals J[0]~J[7] are outputted from the Jason counter 1111 to the edge combiner 1112 to generate eight dividing signals T[0]~T[7], which will be described later. Since P=8 and the frequency of the voltage controlled signal $F_{VCO}[0]$ is 320 MHz, the eight counting signals J[0]~J[7] have respective frequencies of 40 MHz and phases of 0, 45, 90, 135, 180, 225, 270 and 315 degrees. It is understood that the counting signal J[0] has the same frequency and phase as the reference signal.

Figure 6A:
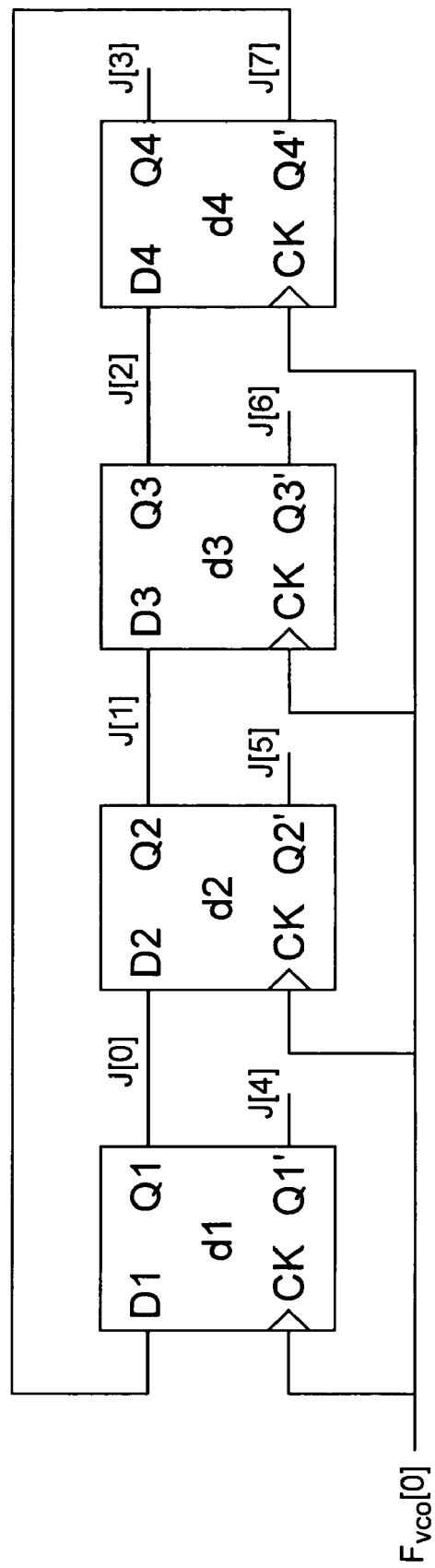
FIG. 6A is a circuit diagram illustrating an embodiment of a Jason counter included in the rising-edge generator of FIG. 5.
Figure 6B:
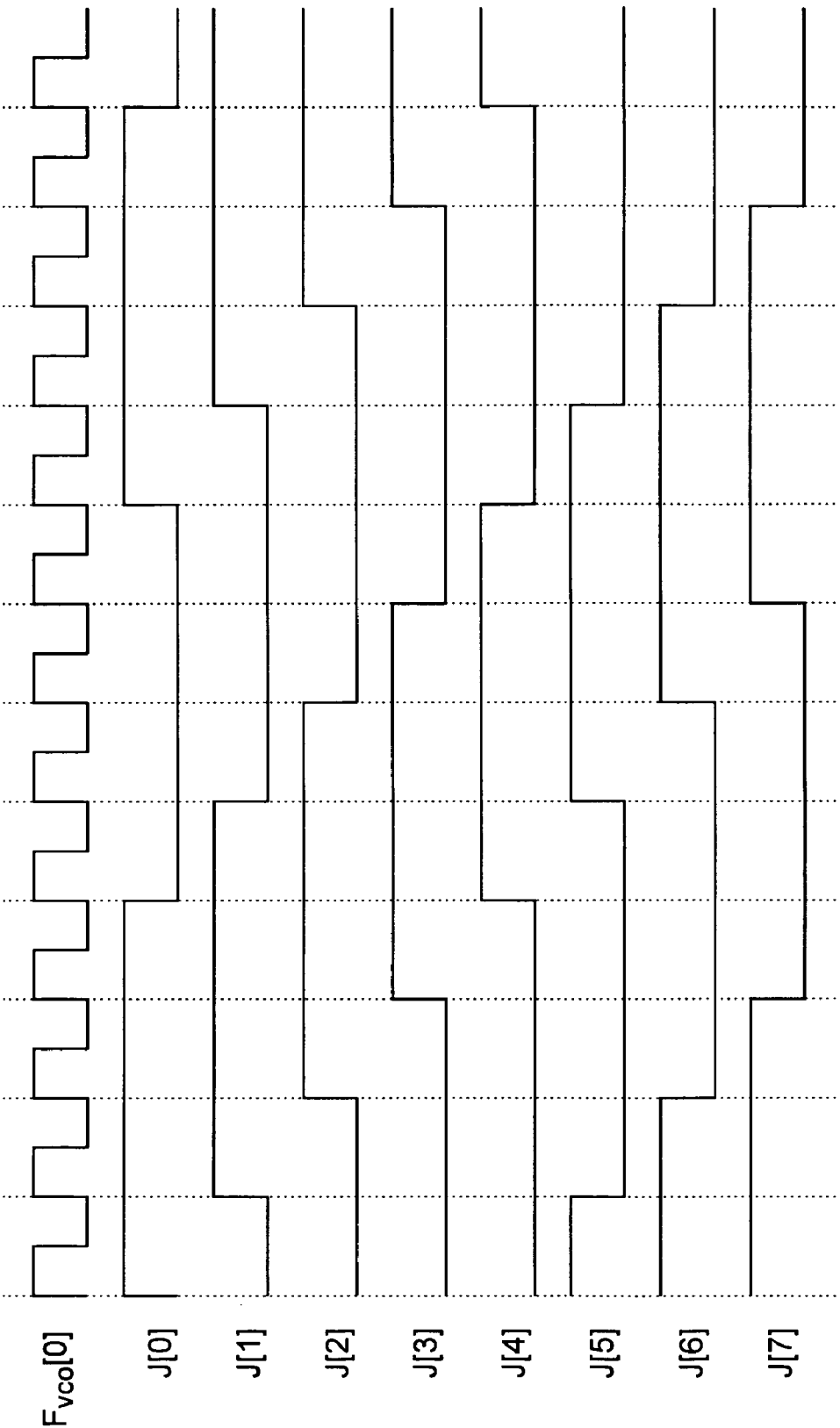
FIG. 6B is a timing sequence diagram schematically showing the relationship among a voltage-controlled output signal $F_{vco}[0]$ and eight counting signals associated with the Jason counter of FIG. 6A.

FIG. 6A illustrates the circuit block diagram of the Jason counter 1111 according to an embodiment of the present invention. The Jason counter 1111 includes four D flip-flops d1, d2, d3 and d4. The clock input terminals CK of all the D flip-flops d1, d2, d3 and d4 are coupled to the voltage controlled signal $F_{VCO}[0]$. A positive-phase output end Q1 of the D flip-flop d1 is coupled to the input end D2 of the D flip-flop d2; a positive-phase output end Q2 of the D flip-flop d2 is coupled to the input end D3 of the D flip-flop d3; a positive-phase output end Q3 of the D flip-flop d3 is coupled to the input end D4 of the D flip-flop d4; and a negative-phase output end Q4' of the D flip-flop d4 is coupled to the input end D1 of the D flip-flop d1. Accordingly, the D flip-flop d1 outputs the counting signal J[0] at the positive-phase output end Q1 while outputting the counting signal J[4] at the negative-phase output end Q1'; the D flip-flop d2 outputs the counting signal J[1] at the positive-phase output end Q2 while outputting the counting signal J[5] at the negative-phase output end Q2'; the D flip-flop d3 outputs the counting signal J[2] at the positive-phase output end Q3 while outputting the counting signal J[6] at the negative-phase output end Q3'; and the D flip-flop d4 outputs the counting signal J[3] at the positive-phase output end Q4 while outputting the counting signal J[7] at the negative-phase output end Q4'. The associated signals are illustrated in FIG. 6B.

Figure 7A:
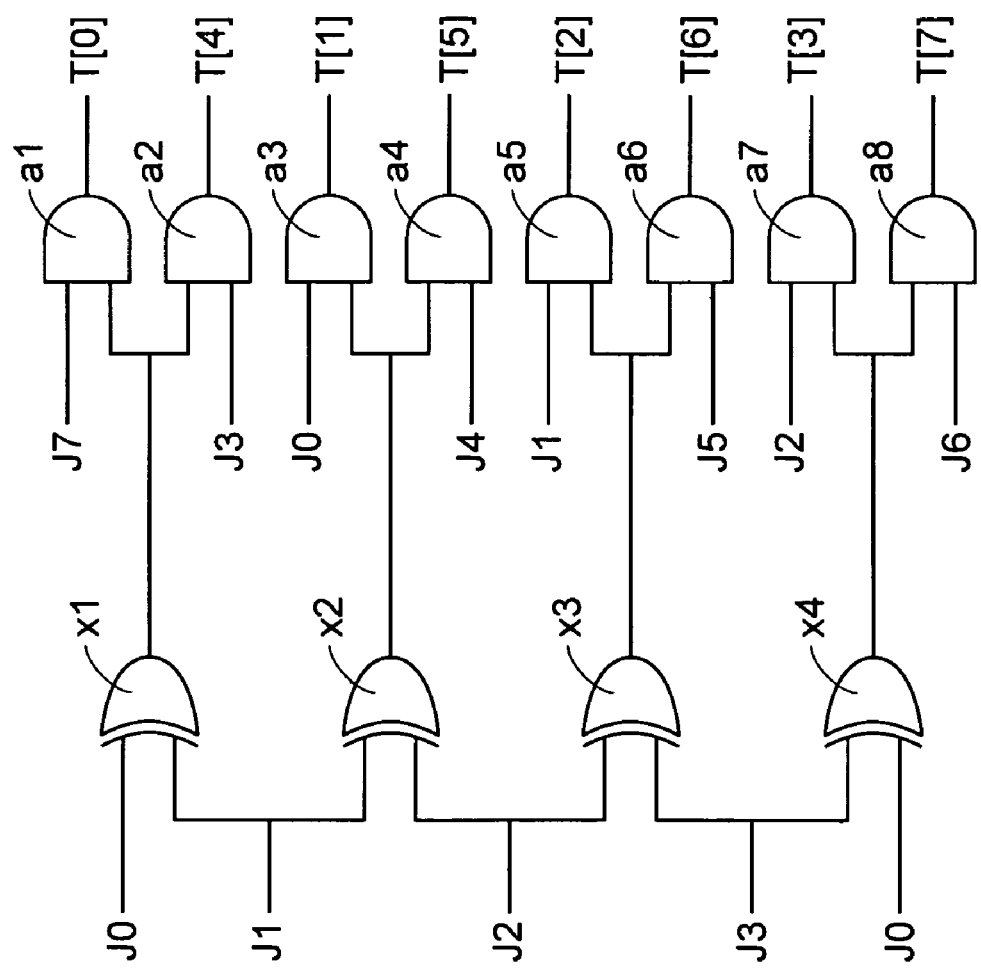
FIG. 7A is circuit diagram illustrating an embodiment of an edge combiner included in the rising-edge generator of FIG. 5.
Figure 7B:
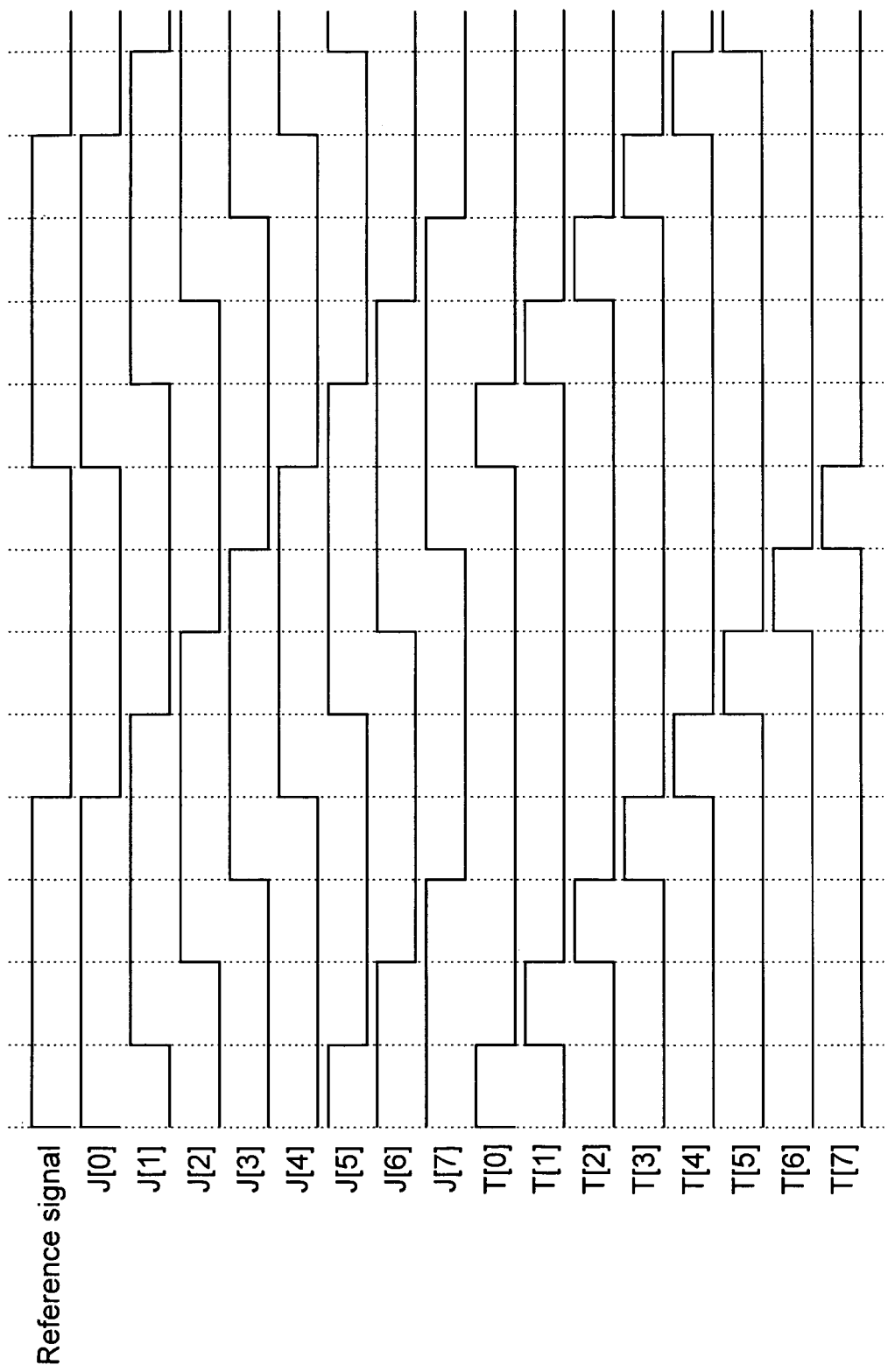
FIG. 7B is a timing sequence diagram schematically showing the relationship among a reference signal, eight counting signals and eight dividing signals associated with the edge combiner of FIG. 7A.

Please refer to FIG. 7A which illustrates the circuit block diagram of the edge combiner 1112 according to an embodiment of the present invention. The edge combiner 1112 includes four XOR gates x1~x4 and eight AND gates a1~a8. The counting signals J[0] and J[1] are coupled to input ends of the XOR gate x1; counting signals J[1] and J[2] are coupled to input ends of the XOR gate x2; the counting signals J[2] and J[3] are coupled to input ends of the XOR gate x3; and counting signals J[3] and J[0] are coupled to input ends of the XOR gate x4. Furthermore, input ends of the AND gate a1 are coupled to the counting signal J[7] and an output end of the XOR gate x1, and the dividing signal T[0] is outputted from an output end of the AND gate a1; input ends of the AND gate a2 are coupled to the counting signal J[3] and the output end of the XOR gate x1, and the dividing signal T[4] is outputted from an output end of the AND gate a2; input ends of the AND gate a3 are coupled to the counting signal J[0] and an output end of the XOR gate x2, and the dividing signal T[1] is outputted from an output end of the AND gate a3; input ends of the AND gate a4 are coupled to the counting signal J[4] and the output end of the XOR gate x2, and the dividing signal T[5] is outputted from an output end of the AND gate a4; input ends of the AND gate a5 are coupled to the counting signal J[1] and an output end of the XOR gate x3, and the dividing signal T[2] is outputted from an output end of the AND gate a5; input ends of the AND gate a6 are coupled to the counting signal J[5] and the output end of the XOR gate x3, and the dividing signal T[6] is outputted from an output end of the AND gate a6; input ends of the AND gate a7 are coupled to the counting signal J[2] and an output end of the XOR gate x4, and the dividing signal T[3] is outputted from an output end of the AND gate a7; and input ends of the AND gate a8 are coupled to the counting signal J[6] and the output end of the XOR gate x4, and the dividing signal T[7] is outputted from an output end of the AND gate a8. The associated signals are illustrated in FIG. 7B, wherein the reference signal is divided into eight zones by the eight dividing signals T[0]~T[7] in the edge combiner 1112.

As described above, the first control bits are provided for several circuits included in the rising/falling edge generating unit 1100 in order to select proper outputs. For example, assuming the first control bits include 12 bits, the first three of them are allocated for controlling the output from the multiplexer 1113 of the rising-edge generating unit 1110; bit number 4 to bit number 6 are allocated for controlling the output from the DPS 1114 of the rising-edge generating unit 1110; bit number 7 to bit number 9 are allocated for controlling the output from the multiplexer (not shown) of the falling-edge generating unit 1150; and the last three bits are allocated for controlling the output from the DPS (not shown) of the falling-edge generating unit 1150.

Figure 8A:
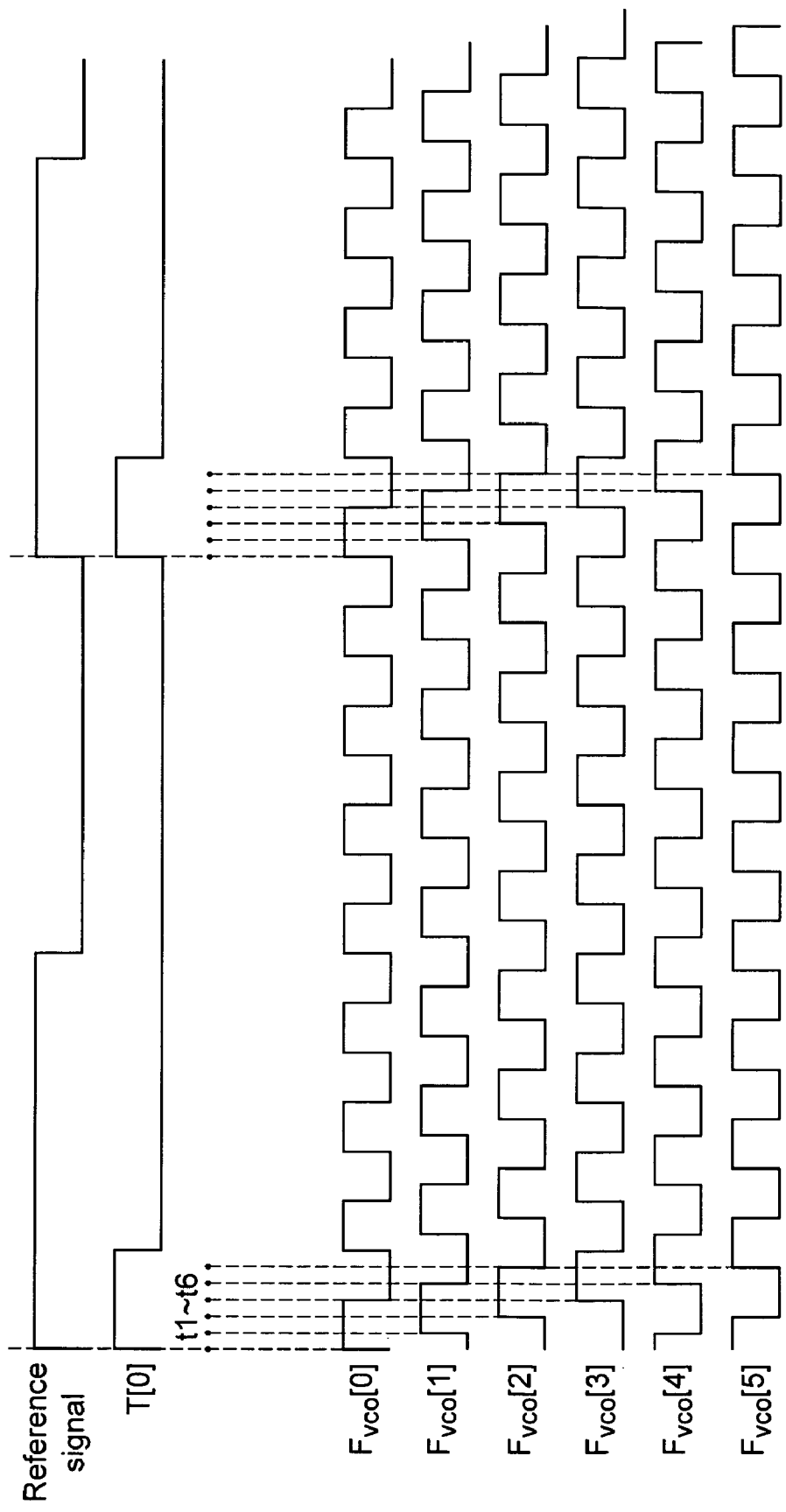
FIG. 8A is a timing sequence diagram schematically showing the generation of a rising point signal by the rising-edge generator of FIG. 5 in a first example.

Herein, examples of the first control bits used for generating rising points are given. Please refer to FIG. 8A. In this example, the dividing signal T[0] is selected to be outputted by the multiplexer 1113 in response to the bit numbers 1~3 of the first control bits. Meanwhile, with the selection of one of the six voltage controlled signals $F_{VCO}[0]$~$F_{VCO}[5]$ to be outputted by the DPS 1114 in response to the bit numbers 4~6 of the first control bits, corresponding candidate timing points, i.e. t1~t6, are determined. In more detail, if the first three bits of the first control bits are (000) and the second three bits of the first control bits are also (000), the multiplexer 1113 selects the dividing signal T[0] and the DPS 1114 selects the voltage controlled signal $F_{VCO}[0]$ to be inputted into the input ends D and CK of the D flip-flop 1115, respectively. Then a pull-high signal is outputted from the output end Q of the D flip-flop 1115 to the edge detector 1116 at the first candidate timing point t1. Upon detecting a rising edge of the pull-high signal, the edge detector 1116 generates a pulse to serve as the rising point signal. If the first three bits of the first control bits are (000) and the second three bits of the first control bits are (001), the multiplexer 1113 selects the dividing signal T[0] and the DPS 1114 selects the voltage controlled signal $F_{VCO}[1]$ to be inputted, respectively. The edge detector 1116 generates a pulse at the candidate timing point t2 to serve as the rising point signal. Likewise, by further changing the second three bits of the first control bits with the first three bits unchanged, a pulse generated at any one of the other candidate timing points t3~t6 may serve as the rising point signal, as depicted in FIG. 8A.

It is to be noted that if the value represented by the second three bits is greater that that of (101), e.g. (111), the DPS 1114 automatically interprets it the same as bits (101). In other words, there are six candidate timing points t1~t6 further dividing the enabled state of the dividing signal T[0].

Figure 8B:
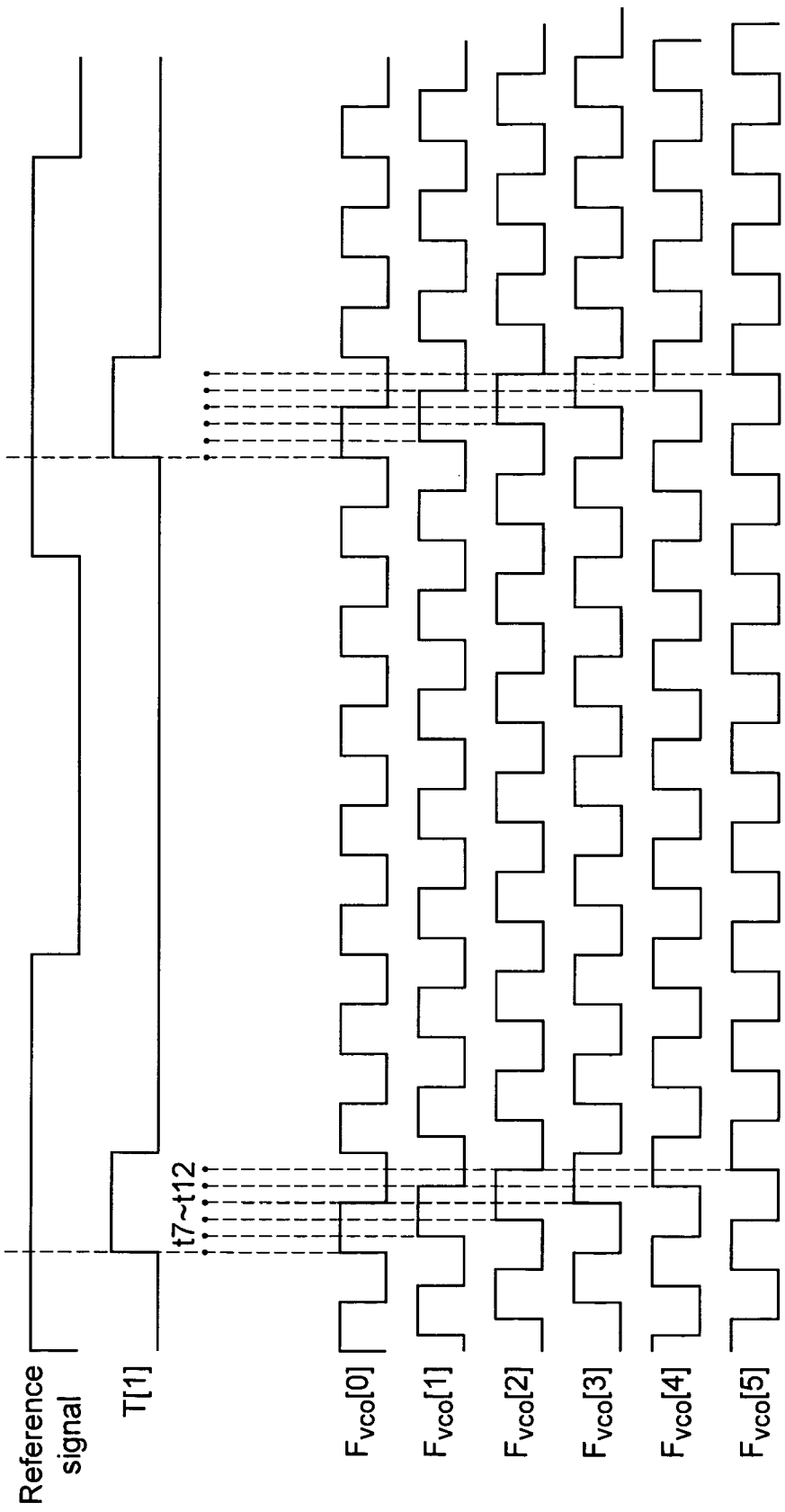
FIG. 8B is a timing sequence diagram schematically showing the generation of a rising point signal by the rising-edge generator of FIG. 5 in a second example.

In a similar example, the dividing signal T[1] is selected to be outputted by the multiplexer 1113 in response to the bit numbers 1~3 of the first control bits being (001), as shown in FIG. 8B. With the selection of one of the six voltage controlled signals $F_{VCO}[0]$~$F_{VCO}[5]$ to be outputted by the DPS 1114 in response to the bit numbers 4~6 of the first control bits being from (000) to (101), corresponding candidate timing points, i.e. t7~t12, are determined. Then the edge detector 1116 generates a pulse at a selected one of the candidate timing points t7~t12 to serve as the rising point signal.

Figure 8C:
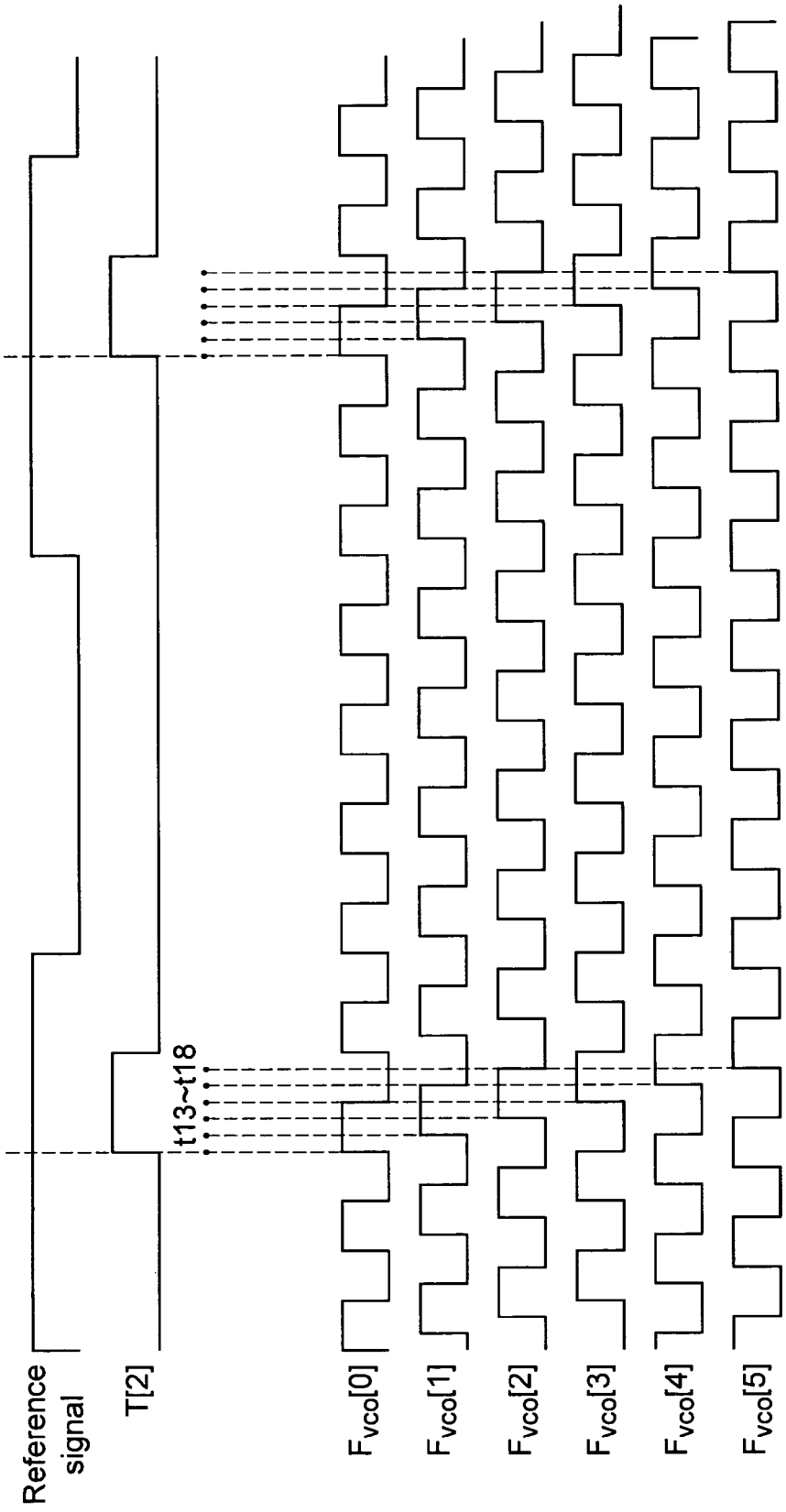
FIG. 8C is a timing sequence diagram schematically showing the generation of a rising point signal by the rising-edge generator of FIG. 5 in a third example.

In another similar example, the dividing signal T[2] is selected to be outputted by the multiplexer 1113 in response to the bit numbers 1~3 of the first control bits being (010), as shown in FIG. 8C. With the selection of one of the six voltage controlled signals $F_{VCO}[0]$~$F_{VCO}[5]$ to be outputted by the DPS 1114 in response to the bit numbers 4~6 of the first control bits being from (000) to (101), corresponding candidate timing points, i.e. t13~t18, are determined. Then the edge detector 1116 generates a pulse at a selected one of the candidate timing points t13~t18 to serve as the rising point signal.

Figure 8D:
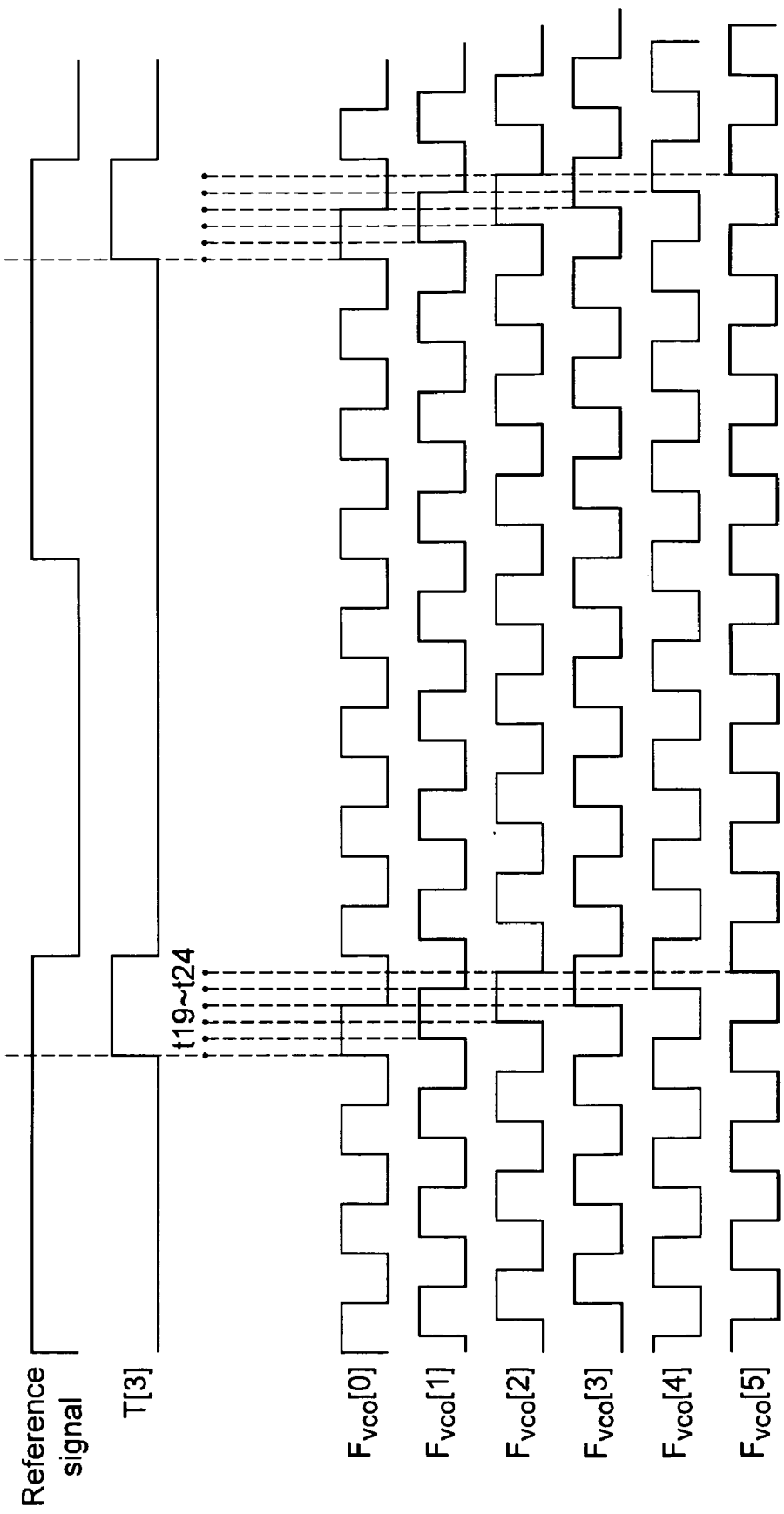
FIG. 8D is a timing sequence diagram schematically showing the generation of a rising point signal by the rising-edge generator of FIG. 5 in a fourth example.

In a further similar example, the dividing signal T[3] is selected to be outputted by the multiplexer 1113 in response to the bit numbers 1~3 of the first control bits being (011), as shown in FIG. 8D. With the selection of one of the six voltage controlled signals $F_{VCO}[0]$~$F_{VCO}[5]$ to be outputted by the DPS 1114 in response to the bit numbers 4~6 of the first control bits being from (000) to (101), corresponding candidate timing points, i.e. t19~t24, are determined. Then the edge detector 1116 generates a pulse at a selected one of the candidate timing points t19~t24 to serve as the rising point signal.

Figure 8E:
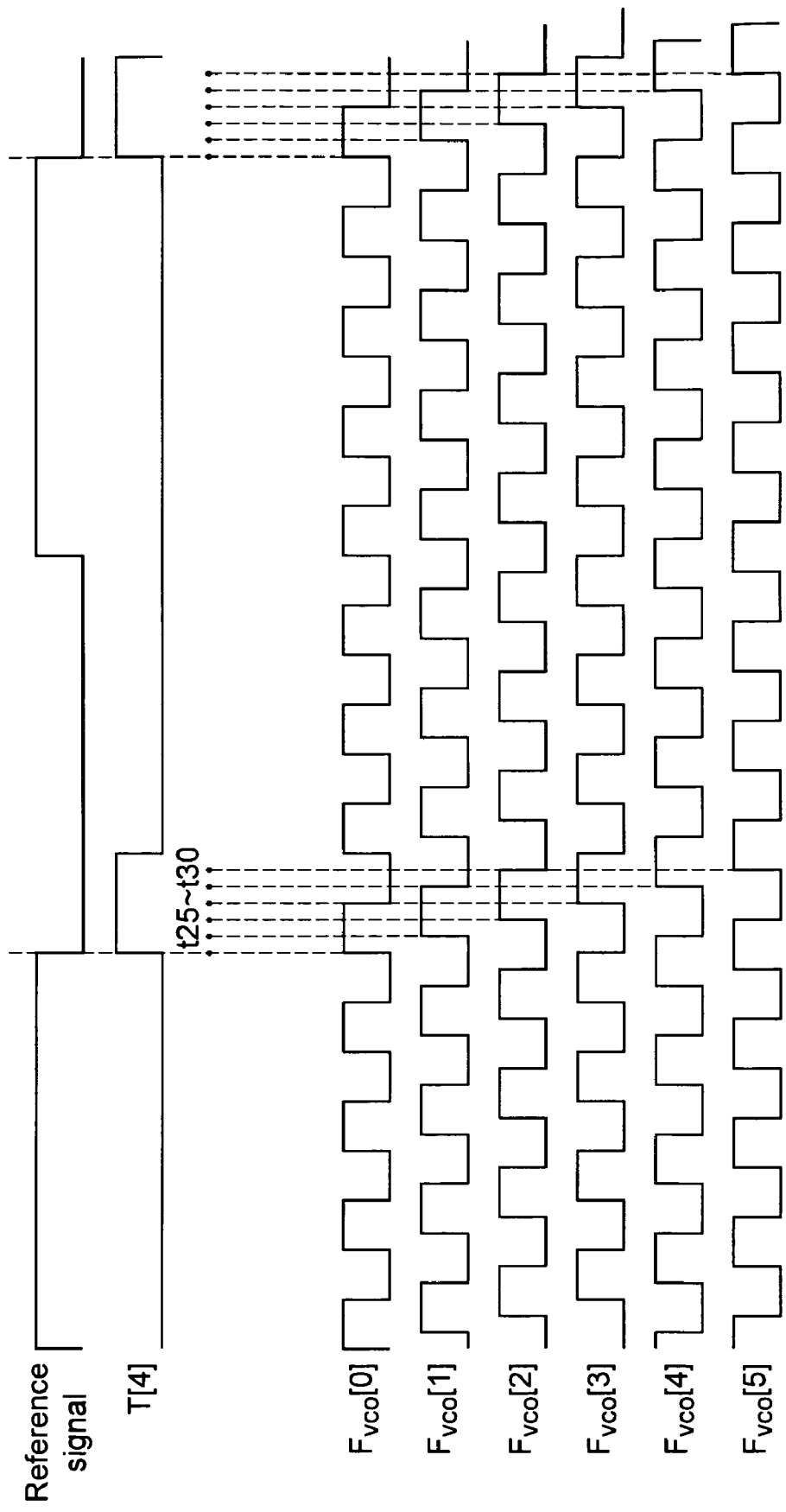
FIG. 8E is a timing sequence diagram schematically showing the generation of a rising point signal by the rising-edge generator of FIG. 5 in a fifth example.

In a still further similar example, the dividing signal T[4] is selected to be outputted by the multiplexer 1113 in response to the bit numbers 1~3 of the first control bits being (100), as shown in FIG. 8E. With the selection of one of the six voltage controlled signals $F_{VCO}[0]$~$F_{VCO}[5]$ to be outputted by the DPS 1114 in response to the bit numbers 4~6 of the first control bits being from (000) to (101), corresponding candidate timing points, i.e. t25~t30, are determined. Then the edge detector 1116 generates a pulse at a selected one of the candidate timing points t25~t30 to serve as the rising point signal.

Likewise, please refer to FIG. 8F. The dividing signal T[5] is selected to be outputted by the multiplexer 1113 in response to the bit numbers 1~3 of the first control bits being (101). With the selection of one of the six voltage controlled signals $F_{VCO}[0]$~$F_{VCO}[5]$ to be outputted by the DPS 1114 in response to the bit numbers 4~6 of the first control bits being from (000) to (101), corresponding candidate timing points, i.e. t31~t36, are determined. Then the edge detector 1116 generates a pulse at a selected one of the candidate timing points t31~t36 to serve as the rising point signal.

Likewise, please refer to FIG. 8G. The dividing signal T[6] is selected to be outputted by the multiplexer 1113 in response to the bit numbers 1~3 of the first control bits being (110). With the selection of one of the six voltage controlled signals $F_{VCO}[0]$~$F_{VCO}[5]$ to be outputted by the DPS 1114 in response to the bit numbers 4~6 of the first control bits being from (000) to (101), corresponding candidate timing points, i.e. t37~t42, are determined. Then the edge detector 1116 generates a pulse at a selected one of the candidate timing points t37~t42 to serve as the rising point signal.

Figure 8H:
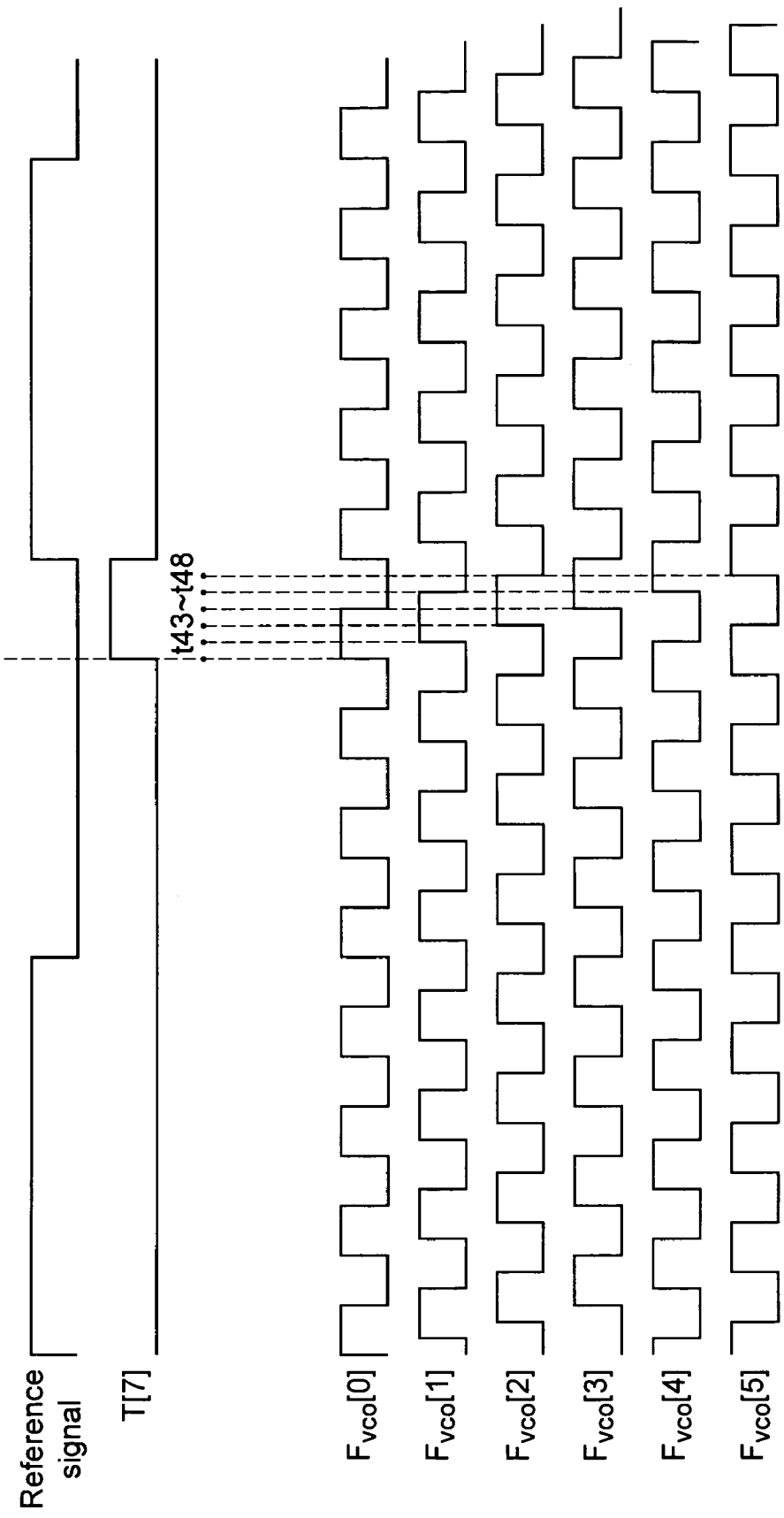
FIG. 8H is a timing sequence diagram schematically showing the generation of a rising point signal by the rising-edge generator of FIG. 5 in an eighth example.

Likewise, please refer to FIG. 8H. The dividing signal T[7] is selected to be outputted by the multiplexer 1113 in response to the bit numbers 1~3 of the first control bits being (111). With the selection of one of the six voltage controlled signals $F_{VCO}[0]$~$F_{VCO}[5]$ to be outputted by the DPS 1114 in response to the bit numbers 4~6 of the first control bits being from (000) to (101), corresponding candidate timing points, i.e. t43~t48, are determined. Then the edge detector 1116 generates a pulse at a selected one of the candidate timing points t43~t48 to serve as the rising point signal.

It is understood from the above descriptions that by varying the first control bits, the rising point signal can be arbitrarily selected to be outputted at one of 48 candidate timing points. In a similar way, the falling point signal can also be arbitrarily selected to be outputted at one of the 48 candidate timing points. By changing rising and/or falling edges, a variety of duty cycles can be obtained. Accordingly, the SR flip-flop 1210 may generate the first timing signal with adjustable rising edge, falling edge and duty cycle.

Figure 9:
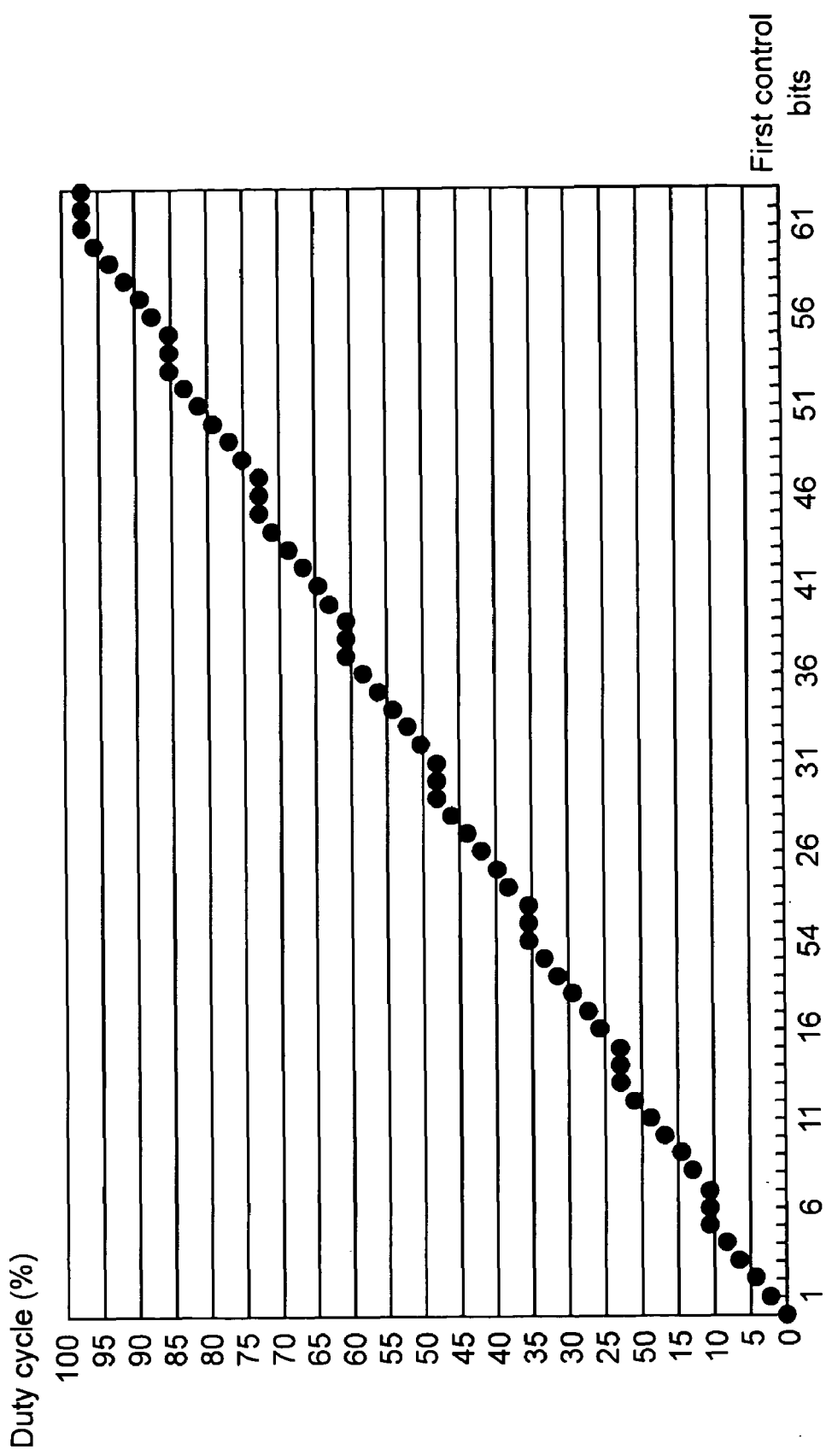
FIG. 9 is a duty-cycle vs. first-control-bits plot wherein the first control bits represent a variety of falling points under a fixed rising point.

FIG. 9 illustrates the variations of the duty cycle with the first control bits on the conditions that the rising point signal is fixed while the falling point signal is changing. It is to be noted that the first control bits are indicated by a value represented by the first six bits thereof.

The above embodiments and examples are described with reference to the first control circuit 1000. Similar discussion is applicable to any additional control circuit which includes the principle circuitry as mentioned above. Furthermore, the numbers of control bits, voltage controlled signals and dividing signals can be selected according to practical designs.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A timing-signal generator, comprising:
   a PLL circuit for outputting M voltage controlled signals in response to a reference signal, wherein every adjacent two of the M voltage controlled signals have the same frequency and a first constant phase difference;
   a rising/falling edge generating unit coupled to the PLL circuit for receiving the M voltage controlled signals, and generating a rising point signal and a falling point signal corresponding to respective ones of M*P candidate timing points which are defined in a cycle of the reference signal according to the M voltage controlled signals; and
   a timing-signal generating unit coupled to the rising/falling edge generating unit for generating a timing signal which toggles high in response to the rising point signal and/or toggles low in response to the falling point signal;
   wherein the rising/falling edge generating unit includes a Jason counter coupled to the PLL circuit for receiving one of the M voltage controlled signals at a time and dividing the frequency $F_{vco}$ of the voltage controlled signal by P to output P counting signals, wherein P is a positive integer and every adjacent two of the P counting signals have the same frequency and a second constant phase difference.

2. The timing-signal generator according to claim 1 wherein the frequency of each of the M voltage controlled signals is $F_{vco}$; the frequency of the reference signal is $F_{ref}$; and $F_{vco}=N*F_{ref}$ where N is a positive integer.

3. The timing-signal generator according to claim 1 wherein the timing-signal generating unit is an SR flip-flop, and a set end thereof receives the rising point signal and a reset end thereof receives the falling point signal.

4. The timing-signal generator according to claim 1 wherein the timing-signal generating unit is a JK flip-flop, and a J end thereof receives the rising point signal and a K end thereof receives the falling point signal.

5. The timing-signal generator according to claim 1 wherein the rising/falling edge generating unit further includes:
   an edge combiner coupled to the Jason counter for generating P dividing signals according to rising edges and falling edges of the P counting signals;
   a multiplexer coupled to the edge combiner for selecting one of the P dividing signals to be outputted according to control bits;
   a digital phase selector coupled to the PLL circuit for selecting one of the M voltage controlled signals to be outputted according to the control bits;
   a D flip-flop coupled to the multiplexer and the digital phase selector for generating an output according to the selected dividing signal and the selected voltage controlled signal as inputs thereof; and
   an edge detector coupled to the D flip-flop for generating a pulse to enable the rising point signal when the output of the D flip-flop is switched from a low level to a high level.

6. The timing-signal generator according to claim 1 wherein the rising/falling edge generating unit further includes:
   an edge combiner coupled to the Jason counter for generating P dividing signals according to rising edges and falling edges of the P counting signals;
   a multiplexer coupled to the edge combiner for selecting one of the P dividing signals to be outputted according to control bits;
   a digital phase selector coupled to the PLL circuit for selecting one of the M voltage controlled signals to be outputted according to the control bits;
   a D flip-flop coupled to the multiplexer and the digital phase selector for generating an output according to the selected dividing signal and the selected voltage controlled signal as inputs thereof; and
   an edge detector coupled to the D flip-flop for generating a pulse to enable the falling point signal when the output of the D flip-flop is switched from a high level to a low level.

7. The timing-signal generator according to claim 1 wherein the PLL circuit includes:
   a phase/frequency detector for detecting phase and frequency differences between the reference signal and a frequency-divided signal to output a phase-difference signal;
   a charge pump coupled to the phase/frequency detector for generating an output current in response to a voltage level of the phase difference signal;
   a loop filter coupled to the charge pump for converting the output current into a controlled voltage
   a voltage-controlled oscillator coupled to the loop filter for generating M voltage controlled signals in response to the controlled voltage; and
   a frequency-dividing unit coupled to the voltage-controlled oscillator and the phase/frequency detector for dividing the frequency of one of the M voltage controlled signals to obtain the frequency-divided signal.

8. A method for use in a PLL-based timing-signal generator to generate a timing signal according to a reference signal, the method comprising steps of:
   receiving M voltage controlled signals in sequence, wherein every adjacent two of the M voltage controlled signals have the same frequency $F_{vco}$ and a first constant phase difference;
   dividing the frequency $F_{vco}$ by P to output P counting signals, wherein P is a positive integer and every adjacent two of the P counting signals have the same frequency equal to 1/P of the frequency $F_{vco}$ of the M voltage controlled signals and a second constant phase difference, thereby defining M*P candidate timing points in a cycle of the reference signal;
   generating a rising point signal corresponding to a first one of the M*P candidate timing points;
   generating a falling point signal corresponding to a second one of the M*P candidate timing points; and
   generating the timing signal which toggles high in response to the rising point signal and toggles low in response to the falling point signal.

9. The method according to claim 8, wherein the rising point signal is generated by:
   generating P dividing signals according rising edges and falling edges of the P counting signals;

generating an output signal in response to one of the P dividing signals and one of the M voltage controlled signals selected according to control bits; and enabling the rising point signal when a voltage level of the output signal is changed from low to high.

10. The method according to claim 8, wherein the falling point signal is generated by:

generating P dividing signals according rising edges and falling edges of the P counting signals;

generating an output signal in response to one of the P dividing signals and one of the M voltage controlled signals according to control bits; and enabling the falling point signal when a voltage level of the output signal is changed from high to low.

11. The method according to claim 8, wherein $F_{vco}=N*F_{ref}$ where N is a positive integer and $F_{ref}$ is the frequency of the reference signal.

12. A timing-signal generator, comprising:

a PLL circuit for outputting M voltage controlled signals in response to a reference signal, wherein every adjacent two of the M voltage controlled signals have the same frequency and a first constant phase difference;

a rising/falling edge generating unit coupled to the PLL circuit for receiving the M voltage controlled signals, and generating a rising point signal and a falling point signal corresponding to respective ones of M*P candidate timing points which are defined in a cycle of the reference signal according to the M voltage controlled signals; and a timing-signal generating unit coupled to the rising/falling edge generating unit for generating a timing signal which toggles high in response to the rising point signal and/or toggles low in response to the falling point signal;

wherein the rising/falling edge generating unit includes:

a Jason counter coupled to the PLL circuit for receiving one of the M voltage controlled signals at a time and dividing the frequency $F_{vco}$ of the voltage controlled signal by P to output P counting signals, wherein P is a positive integer and every adjacent two of the P counting signals have the same frequency and a second constant phase difference;

an edge combiner coupled to the Jason counter for generating P dividing signals according to rising edges and falling edges of the P counting signals;

a multiplexer coupled to the edge combiner for selecting one of the P dividing signals to be outputted according to control bits;

a digital phase selector coupled to the PLL circuit for selecting one of the M voltage controlled signals to be outputted according to the control bits;

a D flip-flop coupled to the multiplexer and the digital phase selector for generating an output according to the selected dividing signal and the selected voltage controlled signal as inputs thereof; and an edge detector coupled to the D flip-flop for generating a pulse to enable the rising point signal when the output of the D flip-flop is switched from a low level to a high level or enable the falling point signal when the output of the D flip-flop is switched from a high level to a low level.

* * * * *